United States Patent [19]
Liddle et al.

[11] Patent Number: 5,999,097
[45] Date of Patent: Dec. 7, 1999

[54] ELECTRICAL LEAD AND FINANCIAL TERMINAL INCLUDING THE LEAD

[75] Inventors: Mark J. D. Liddle, Dundee; Stephen B. Hunter, Kinross, both of United Kingdom

[73] Assignee: NCR Corporation, Dayton, Ohio

[21] Appl. No.: 09/082,852

[22] Filed: May 21, 1998

[51] Int. Cl.⁶ .................................................. G08B 13/02
[52] U.S. Cl. ........................... 340/550; 174/1; 174/254; 174/257; 439/44; 439/49; 439/55
[58] Field of Search ............................ 340/550; 174/257, 174/250, 117 F, 1, 254, 264; 439/44, 43, 55, 49

[56] References Cited

U.S. PATENT DOCUMENTS

| | | | |
|---|---|---|---|
| 3,838,317 | 9/1974 | Coyne | 439/49 |
| 4,785,743 | 11/1988 | Dalphin | 340/550 |
| 5,224,430 | 7/1993 | MacPherson | 340/550 |
| 5,506,566 | 4/1996 | Oldfield et al. | 340/550 |

FOREIGN PATENT DOCUMENTS

| | | |
|---|---|---|
| 2182176 | 5/1987 | United Kingdom . |
| 2256957 | 12/1992 | United Kingdom . |

OTHER PUBLICATIONS

F. J. Korosec et al., "Programmable Connector", IBM Technical Disclosure Bulletin, vol. 15, No. 3, Aug. 1972, pp. 865–866, XP002076441, New York, US.

*Primary Examiner*—Glen Swann

[57] ABSTRACT

An electrical lead has a first set of terminals (14) at one end of the lead and a second set of terminals (15) at the other end of the lead. A connector circuit (11,12) respectively connects the terminals (14) to the terminals (15). This circuit (11,12) is adjustable so as to change the connection paths between the first and second sets of terminals (14,15). The connector circuit (11,12) is surrounded by a security enclosure which comprises flexible sheet means of electrically insulating material carrying an array of lines of electrically security conductors. Monitoring means are connected to the security conductors to detect a change in an electrical characteristic thereof resulting from damage to the security enclosure. The invention can be used in a financial terminal, and provides security against a fraudulent attack on the lead intended to gain access to confidential information, such as a personal identification number, transmitted over the lead.

10 Claims, 3 Drawing Sheets

ELECTRICAL LEAD AND FINANCIAL TERMINAL INCLUDING THE LEAD

BACKGROUND OF THE INVENTION

The present invention relates to an electrical lead having connecting terminals at each end of the lead. An electrical lead in accordance with the invention is of particular advantage in securely interconnecting a membrane keyboard to the keyboard scanning circuits of a financial terminal.

In a financial terminal, consideration must be given to the detection and prevention of attempted access to confidential information transmitted over the electrical lead between a membrane keyboard and a physically secure area in which keyboard scanning electronic circuits are located. Such lead is normally regarded as one of the weakest points for an attack and is difficult to protect. An attack on such lead would normally be made by the attachment of taps to conductors of the lead or by passively monitoring the lead by the use of current probes in order to gain information such as personal identification numbers (PINs).

SUMMARY OF THE INVENTION

It is an object of the invention to provide an electrical lead having a construction which provides an enhancement in security against a fraudulent attack intended to gain access to confidential information transmitted over the lead.

According to the present invention there is provided an electrical lead having a first set of terminals at one end of the lead and a second set of terminals at the other end of the lead, and a connector circuit for respectively connecting the terminals of said first set to the terminals of said second set, characterized in that said connector circuit is adjustable so as to change the connection paths between said first and second sets of terminals, and in that there is provided a security enclosure surrounding said connector circuit, said enclosure comprising flexible sheet means of electrically insulating material carrying an array of lines of electrical security conductors, and monitoring means connected to the security conductors to detect a change in an electrical characteristic thereof resulting from damage to said security enclosure.

BRIEF DESCRIPTION OF THE DRAWINGS

One embodiment of the invention will now be described, by way of example, with reference to the accompanying drawings, in which.

DETAILED DESCRIPTION

Figure 1:
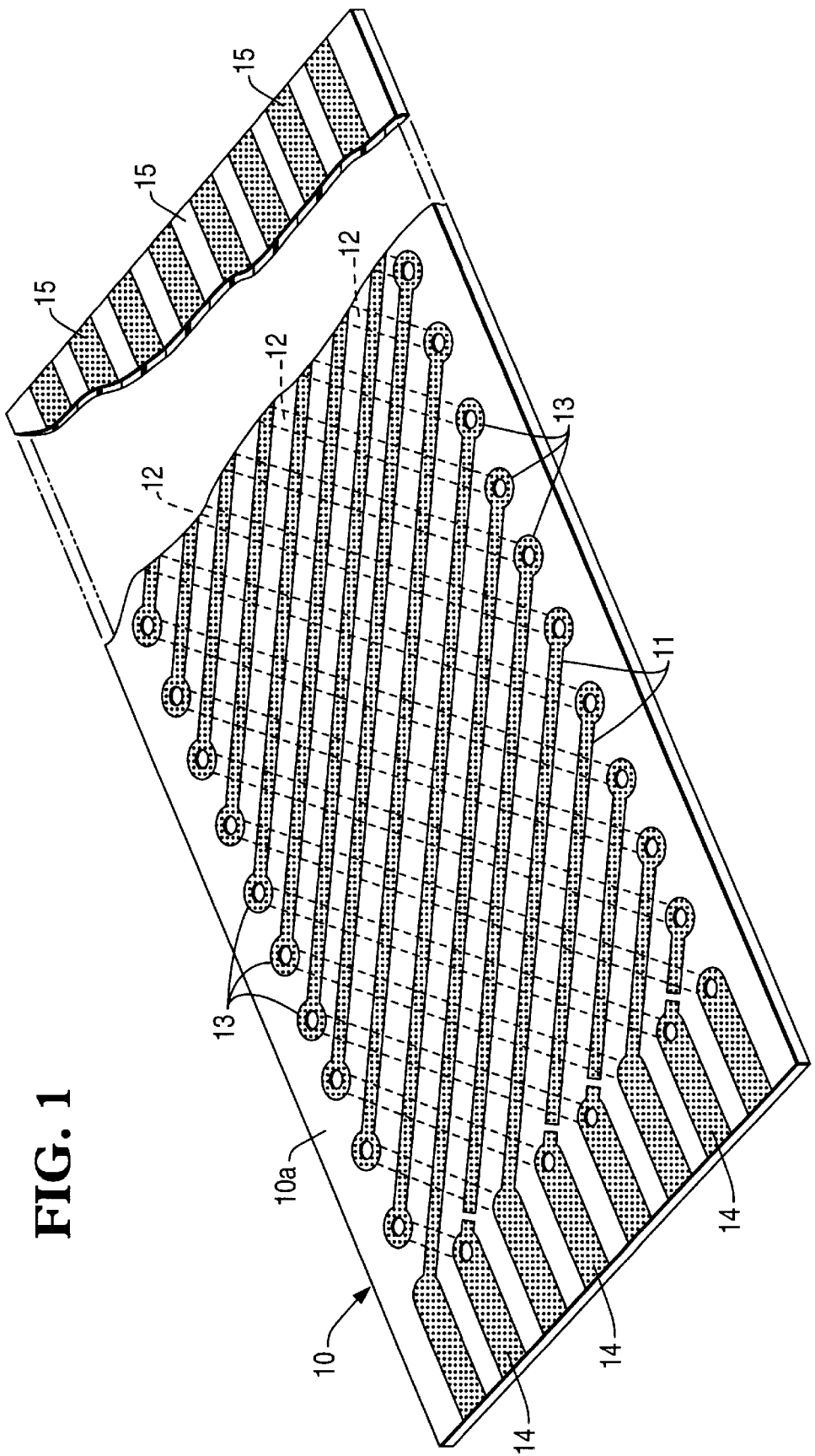
FIG. 1 is a perspective view, partly broken away, of an inner lead member included in an electrical lead according to the present invention.

Referring to FIG. 1, there is shown an inner lead member 10 comprising an elongated, electrically insulating laminar support member 10a carrying a pattern of lines of electrical conductors 11 on the upper face and a further pattern of lines of electrical conductors 12 on the lower face. The lower pattern is shown in dotted lines to distinguish the conductors 12 thereof from the conductors 11 of the upper pattern.

The conductors 11 of the upper pattern can be seen to intersect the conductors 12 of the lower pattern and the conductors 11,12 of each pattern terminate adjacent the edges of the support member 10a in a pad 13, the pads 13 on one face of the support member 10a being in register with the pads 13 on the other face of the support member 10a. A connection is made between each pair of registering pads 13 by forming a hole through the support member 10a such that when the conductors 11,12 are formed, preferably by printing, the ink used to form the conductors on one side extends through the hole into contact with the pad 13 on the other side. The conductors 11,12 may be printed on one side of the support member 10a before the holes are formed. The holes may then be formed in the support member 10a and the connecting holes are lined with ink as the conductors are printed on the other side of the support member 10a.

The patterns of conductors 11 and 12 form connection paths between connecting terminals 14 at one end of the support member 10a and corresponding connecting terminals 15 at the other end of the support member 10a. It should be understood that the terminals 14 are respectively connected to corresponding ones of the terminals 15. However, the connection path between each terminal 14 and the corresponding terminal 15 can be changed, even though the terminal 14 remains connected to the same terminal 15. The connection path from each terminal 14 is made up of an alternating sequence of the conductors 11 and 12, adjacent ends of adjacent conductors 11,12 being interconnected by way of a pad 13. As shown in greater detail in FIG. 2, each of the terminals 14 is either directly connected to a conductor 11 (as in the case of the terminal labeled 14a) or is connected to a conductor 12 (as in the case of the terminal labeled 14b). Thus, the terminal 14a is connected directly to a conductor 11 in the upper pattern but has no direct connection to a conductor 12 in the lower pattern. The terminal 14b on the other hand has a direct connection through a via hole 16 to a conductor 12 in the lower pattern. The conductor 11 in the upper pattern immediately adjacent the terminal 14b is disconnected from the terminal 14b by means of a cut 17 through the conductor 11.

It will be observed that each terminal such as the terminal 14a has an electrical connection path which proceeds through a conductor 11 in the upper pattern, through a conductor 12 in the lower pattern and thence by alternate conductors 11 and 12 to complete the circuit path to the corresponding connecting terminal 15 at the other end of the inner lead member 10. Each terminal such as the terminal 14b is connected to an electrical connection path which proceeds through a conductor 12 in the lower path pattern, through a conductor 11 in the upper pattern and thence through alternate conductors 12,11 to the respective connecting terminal 15 at the other end of the inner lead member 10.

Although only eight terminals 14 and eight terminals 15 are shown in FIG. 1, the actual number of terminals 14 is twenty nine and the actual number of terminals 15 is also twenty nine. A selection is made during manufacture of the inner lead member 10 concerning which of the terminals 14 is connected first to a conductor 11 in the upper pattern. Such terminals will correspond to the terminal 14a in FIG. 2. A selection is also made of which terminals are connected first to a conductor 12 in the lower pattern. Such terminals will correspond to the terminal 14b in FIG. 2. Since there are twenty nine of the terminals 14, it is possible to arrive at $2^{29}$ different combinations of connection paths between the terminals 14 and the terminals 15. The selected combination is varied from one inner lead member to the next so that an attacker attempting to probe the inner lead member will not be able to predict where the current paths cross over from one pattern to the other.

The angle of each conductor 11 and 12 in the upper and lower patterns relative to the longitudinal direction of the lead member 10 is such that the start of each circuit path from a terminal 14 is aligned with the end of the circuit path at the corresponding terminating terminal 15.

Figure 2:
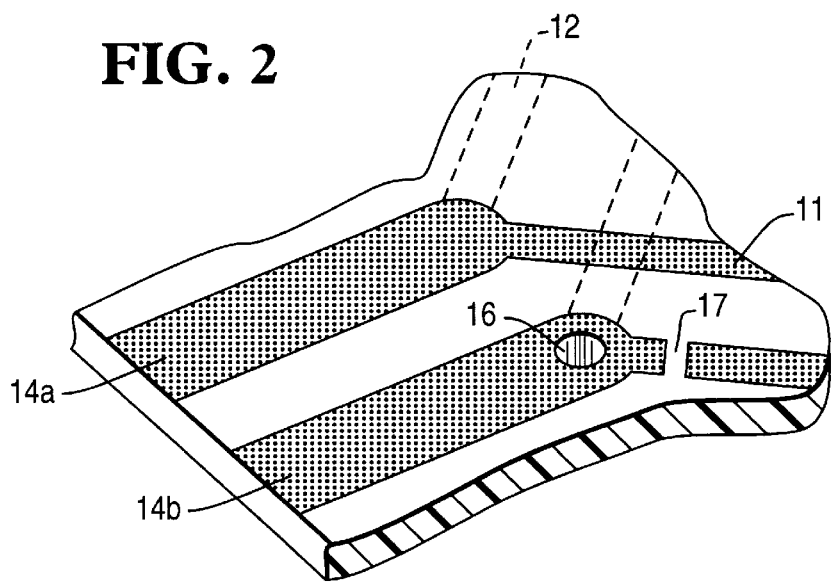
FIG. 2 is an enlarged view of part of the inner lead member of FIG. 1.
Figure 3:
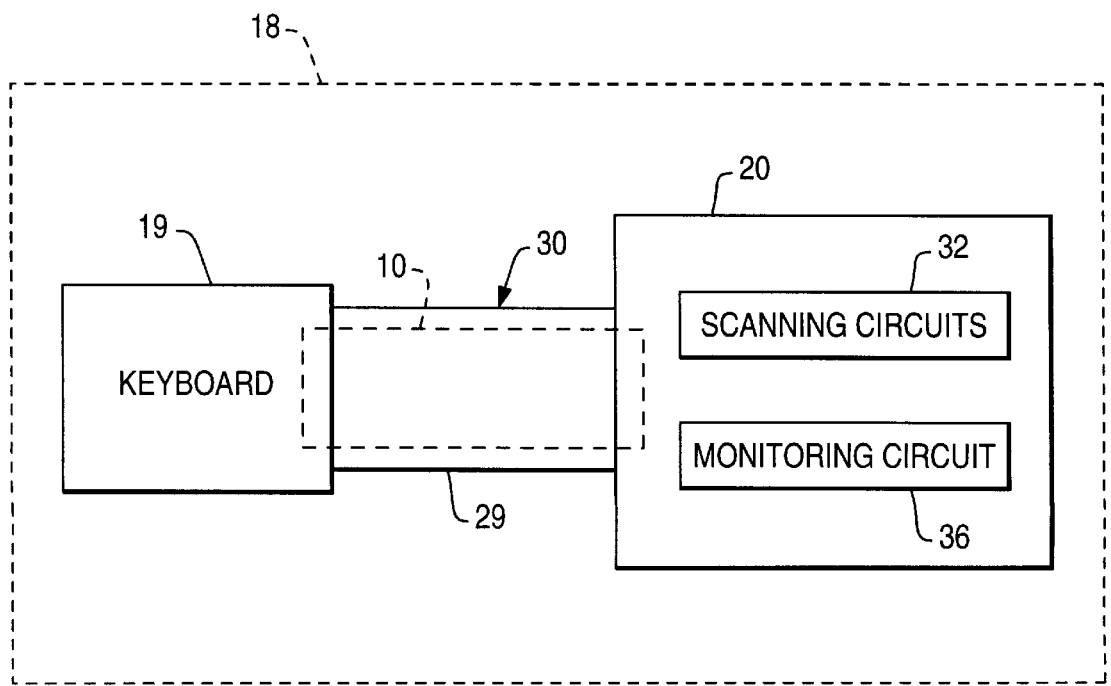
FIG. 3 shows, in schematic form, a lead in accordance with the invention employed in a financial terminal.

Referring now to FIG. 3, there is shown, schematically, a financial terminal 18 including a membrane keyboard 19 which is connected to scanning circuits 32 of the financial terminal 18 by an electrical lead 30, the scanning circuits 32 being located in a physically secure area 20 of the terminal 18. The lead 30 includes the inner lead member 10 formed by the laminar support member 10a, the patterns of conductors 11 and 12 and the terminals 14,15 as shown in FIGS. 1 and 2. The scanning circuits 32 serve to scan the terminals 15 of the lead 30 for the purpose of receiving signals transmitted from the keyboard 19 over the lead 30.

The lead 30 is also provided with an outer enclosing structure 29 which surrounds the inner lead member 10 and which forms a security enclosure for the connection paths between the terminals 14 and the terminals 15 of the lead 30. It should be understood that the terminals 14 of the lead 30 are located in a physically secure structure which forms part of the keyboard 19, and that the terminals 15 are located in the physically secure area 20 where the scanning circuits 32 are located. The security enclosure 29 extends fully between the physically secure area 20 and the physically secure structure forming part of the keyboard 19. The security enclosure 29 will now be described with reference to FIG. 4 which shows details included in a flexible sheet 21 which is used together with a second, identical sheet (not shown) to form the enclosure 29.

The flexible sheet 21 is more fully described in the specification GB-A-2 256 957 and reference to that specification will elucidate the features of construction of the sheet 21. For the purposes of understanding the present invention, it is sufficient to appreciate that the sheet 21 is of insulating material and carries conductive lines 22 and 24 on each face which extend diagonally across the sheet 21. The lines 22,24 extend obliquely relative to one another to divide the sheet 21 into diamond-shaped areas. Each line 22,24 terminates at each end at an edge portion of the sheet 21 in a pad 25, the pads 25 on one face of the sheet 21 registering with pads 25 on the opposite face of the sheet 21. Connections are made between the pads 25 so as to interconnect the lines 22,24 on the two faces of the sheet 21 as is more fully described in the specification GB-A-2 256 957.

Figure 4:
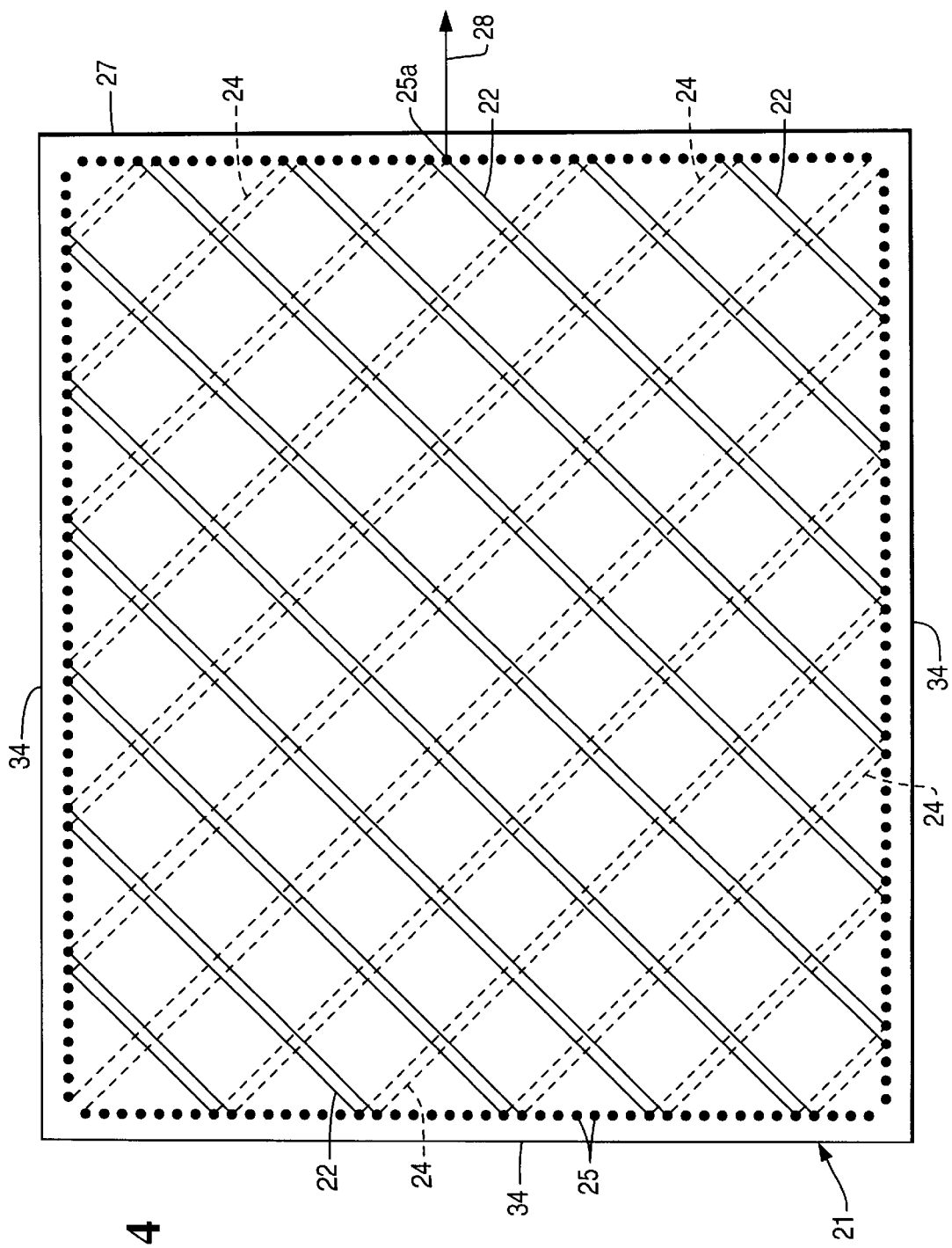
FIG. 4 shows one of a pair of flexible sheets used to form a security enclosure member for use in enclosing the inner lead member of FIGS. 1 and 2.

The lines 22,24 are so connected as to form a number of conductive loops of which one only is shown in FIG. 4 for the sake of clarity. The ends of each loop terminate at an edge 27 of the sheet 21. Thus, the ends of the loop shown in FIG. 4 terminate at aligned pads 25a adjacent the edge 27. It should be understood that the aligned pads 25a are not interconnected and that the other conductive loops of the sheet 21 are all electrically connected in series with the loop shown in FIG. 4. The security enclosure 29 is formed by adhesively securing the long edges 34 of the sheet 21 to the long edges of the second, identical sheet, with the support member 10a held between the two sheets. The conductive loops of the second sheet are connected in series with the loops of the sheet 21 so as to form one continuous conductor. If an attempt is made to penetrate the security enclosure 29 by cutting, abrasion, the application of solvents or by the application of heat, one or more of the loops will be damaged so as to break the continuous conductor. Monitoring of the security enclosure 29 is accomplished by a monitoring circuit 36 located in the secure area 20.

The monitoring circuit 36 applies a voltage across the ends of the continuous conductor, and monitors the voltage appearing on a connector 28 connected to the mid point of the continuous conductor (i.e. the point where the loops of the sheet 21 join the loops of the second sheet). If the continuous conductor is broken, the monitoring circuit 36 will detect a change in the voltage appearing on the connector 28 which will be indicative that an attack has been made on the security enclosure 29. The protection afforded to the lead 30 is therefore constituted by the penetration detection layer provided by the security enclosure 29 and associated monitoring circuit 36 and by the variable layout of the connection paths between the terminals 14 and the terminals 15 which maximizes the difficulty involved in a fraudulent monitoring of the output lines from the keyboard 19.

As shown in FIG. 1, the conductors 11 and 12 extend as straight conductors from one edge of the support member 10a to the other. The conductors may alternatively extend in a non-linear fashion. The conductors 11 and 12 are formed by an ink which is of the same general formulation as the ink used to form the matrix of lines on the flexible sheet 21 but is preferably silver doped to decrease its resistivity.

What is claimed is:

1. An electrical lead comprising:

a first set of terminals at one end of the lead;

a second set of terminals at the other end of the lead;

a connector circuit for respectively connecting the terminals of the first set to the terminals of the second set, the connector circuit being adjustable so as to change the connection paths between the first and second sets of terminals;

a security enclosure surrounding the connector circuit, the enclosure including a flexible sheet of electrically insulating material carrying an array of lines of electrical security conductors; and monitoring means connected to the security conductors and for detecting a change in an electrical characteristic thereof resulting from damage to the security enclosure.

2. An electrical lead according to claim 1, wherein the connector circuit is formed by first and second patterns of electrical conductors respectively carried on opposite faces of an elongated electrically insulating laminar support member, the first and second sets of terminals also being carried on the laminar support member, each connection path between a terminal of the first set and a terminal of the second set being made up of a sequence of electrical conductors alternately located on the opposite faces of the support member with adjacent ends of adjacent conductors in the sequence being electrically connected together via a hole in the support member.

3. An electrical lead according to claim 2, wherein each terminal of the first set is adjustably connected either to a conductor of the first pattern or to a conductor of the second pattern.

4. An electrical lead according to claim 3, wherein each terminal of the first set is connected to a predetermined one of the terminals of the second set regardless of whether the terminal of the first set is connected to a conductor of the first pattern or to a conductor of the second pattern.

5. An electrical lead according to claim 2, wherein apart from the first and last conductors in each sequence, each conductor of the first and second patterns extends between two terminal portions respectively located adjacent the long edges of the support member, each terminal portion on one face of the support member being aligned with, and electrically connected to, a terminal portion on the opposite face of the support member.

6. An electrical lead according to claim 5, wherein each terminal portion is in the form of a pad which is electrically connected to the aligned pad on the opposite face of the support member via a hole in the support member.

7. An electrical lead according to claim 2, wherein the first and second patterns of conductors are formed by printing resistive ink on the support member.

8. An electrical lead according to claim 7, wherein the ink is a silver doped ink.

9. An electrical lead according to claim 1, wherein the lines of security conductors are connected together in series to form a continuous electrical conductor.

10. An electrical lead according to claim 9, wherein the monitoring means applies a voltage across the continuous conductor and monitors the voltage appearing at an intermediate point in the continuous conductor.

* * * * *

UNITED STATES PATENT AND TRADEMARK OFFICE
CERTIFICATE OF CORRECTION

PATENT NO. : 5,999,097
DATED : December 7, 1999
INVENTOR(S) : Mark J. D. Liddle et al.

It is certified that error appears in the above-indentified patent and that said Letters Patent is hereby corrected as shown below:

On the title page item   "[22] Filed:", line should be inserted -- [30] Foreign Application Priority Date May 31, 1997 [GB] United Kingdom....9711181.9 --.

Signed and Sealed this

Tenth Day of April, 2001

Attest:

NICHOLAS P. GODICI

Attesting Officer     Acting Director of the United States Patent and Trademark Office